United States Patent
Strobel et al.

(10) Patent No.: US 10,972,134 B2
(45) Date of Patent: Apr. 6, 2021

(54) LOW-DENSITY PARITY-CHECK (LPDC) CODED MODULATION (LCM) WITH ALIGNMENT OF LDPC CODEWORDS AND DISCRETE MULTI-TONE (DMT) SYMBOL BOUNDARIES

(71) Applicant: MaxLinear, Inc., Carlsbad, CA (US)

(72) Inventors: Rainer Strobel, Munich (DE); Vladimir Oksman, Morganville, NJ (US)

(*) Notice: Subject to any disclaimer, the term of this patent is extended or adjusted under 35 U.S.C. 154(b) by 14 days.

(21) Appl. No.: 16/585,616

(22) Filed: Sep. 27, 2019

(65) Prior Publication Data

US 2020/0153458 A1 May 14, 2020

Related U.S. Application Data

(60) Provisional application No. 62/759,935, filed on Nov. 12, 2018.

(51) Int. Cl.
*H03M 13/25* (2006.01)
*H04L 1/00* (2006.01)
*H03M 13/11* (2006.01)

(52) U.S. Cl.
CPC ..... *H03M 13/255* (2013.01); *H03M 13/1102* (2013.01); *H04L 1/0041* (2013.01); *H04L 1/0068* (2013.01)

(58) Field of Classification Search
CPC ......... H03M 13/1515; H03M 13/6533; H03M 13/6362; H03M 13/255; H04L 1/0007; H04L 1/0009; H04L 1/0013; H04L 1/0041; H04L 1/0058; H04L 1/0068; H04L 5/0044
See application file for complete search history.

(56) References Cited

U.S. PATENT DOCUMENTS

| | | | |
|---|---|---|---|
| 6,307,889 B1 * | 10/2001 | Chun | H04L 27/2608 375/260 |
| 2007/0110176 A1 * | 5/2007 | Wu | H04L 1/0009 375/260 |
| 2013/0051484 A1 * | 2/2013 | Kim | H04L 5/0053 375/260 |

OTHER PUBLICATIONS

Wolkerstorfer et al., Enabling greener DSL access network by their stabilization with artificial noise and SNR margin, Springer Netherlands, Cluster Computing, vol. 16, No. 3, pp. 407 to 419. (Year: 2013).*

* cited by examiner

*Primary Examiner* — Shelly A Chase
(74) *Attorney, Agent, or Firm* — Maschoff Brennan

(57) ABSTRACT

A system for a digital subscriber line (DSL) network with a DSL interface can operate with processing circuitry that can generate symbols in multicarrier communications with codewords for modulation of a parity check. The codewords can be aligned with symbol boundaries of the symbols in a continuous transmission of the multi-carrier communications. The processing circuitry reduces a number of parity bits by puncturing and a number of data bits for shortening of the codewords so that a codeword boundary is aligned with a symbol boundary for one or more symbols, or a transmission frame of symbols.

22 Claims, 7 Drawing Sheets

LOW-DENSITY PARITY-CHECK (LPDC) CODED MODULATION (LCM) WITH ALIGNMENT OF LDPC CODEWORDS AND DISCRETE MULTI-TONE (DMT) SYMBOL BOUNDARIES

REFERENCE TO RELATED APPLICATIONS

This application claims the benefit of U.S. Provisional Application No. 62/759,935 filed Nov. 12, 2018, entitled "LOW-DENSITY PARITY-CHECK (LPDC) CODED MODULATION (LCM) WITH ALIGNMENT OF LDPC CODEWORDS AND DISCRETE MULTI-TONE (DMT) SYMBOL BOUNDARIES", the contents of which are herein incorporated by reference in their entirety.

FIELD

The present disclosure relates to code modulation in networking architectures, and more specifically, to aligning low-density parity-check (LDPC) coded modulation (LCM) codewords and discrete multi-tone (DMT) symbol boundaries.

BACKGROUND

Wireless communication technology uses various standards and protocols to transmit data between a node (e.g., a transmission station, or modem) and a wireless device (e.g., a mobile device), or a user equipment (UE). Some wireless devices communicate using orthogonal frequency-division multiplexing (OFDM) symbols, discrete multi-tone (DMT) symbols, or other standard type. The symbols can be used to separate a digital subscriber line (DSL) signals, for example, so that a usable frequency range is separated into different frequency bands or channels. DMT/OFDM systems can operate on multicarrier communication systems with a large number of carriers, e.g., 4096, 8192, or other such carriers. The transmitter as well as the receiver further utilizes storage for this amount of carrier data.

When using a low-density parity-check (LDPC) code as an inner code for LDPC coded modulation (LCM), the inner code operates on large code blocks, e.g., 12,000 bits. LCM uses a certain maximum number of LDPC bits per tone (or sub-carrier), typically 2-4 bits. In the case of 4 bits, the LDPC codeword can span over at least 3,000 DMT carriers. If a DMT symbol includes less than 3000 carriers, LDPC codewords can span over multiple DMT symbols, which will increase latency.

Furthermore, there can be data bits loaded on DMT carriers which are not necessarily processed by the LDPC code. Those bits have to be associated with the LDPC coded bits (LCM bits) for corresponding carriers. If the LDPC codeword spans multiple symbols, multiple DMT symbols have to be concurrently processed, which requires additional memory for storage of carrier data.

Another issue with the use of LCM is framing synchronization. If not all symbols in the frame are transmitted and LDPC codewords are spread over multiple symbols, the receiver has to know how many LDPC coded bits were in the last transmitted symbol. This information has to be communicated to the receiver, which can add further complexity efforts and robustness issues.

DESCRIPTION

Figure 1:
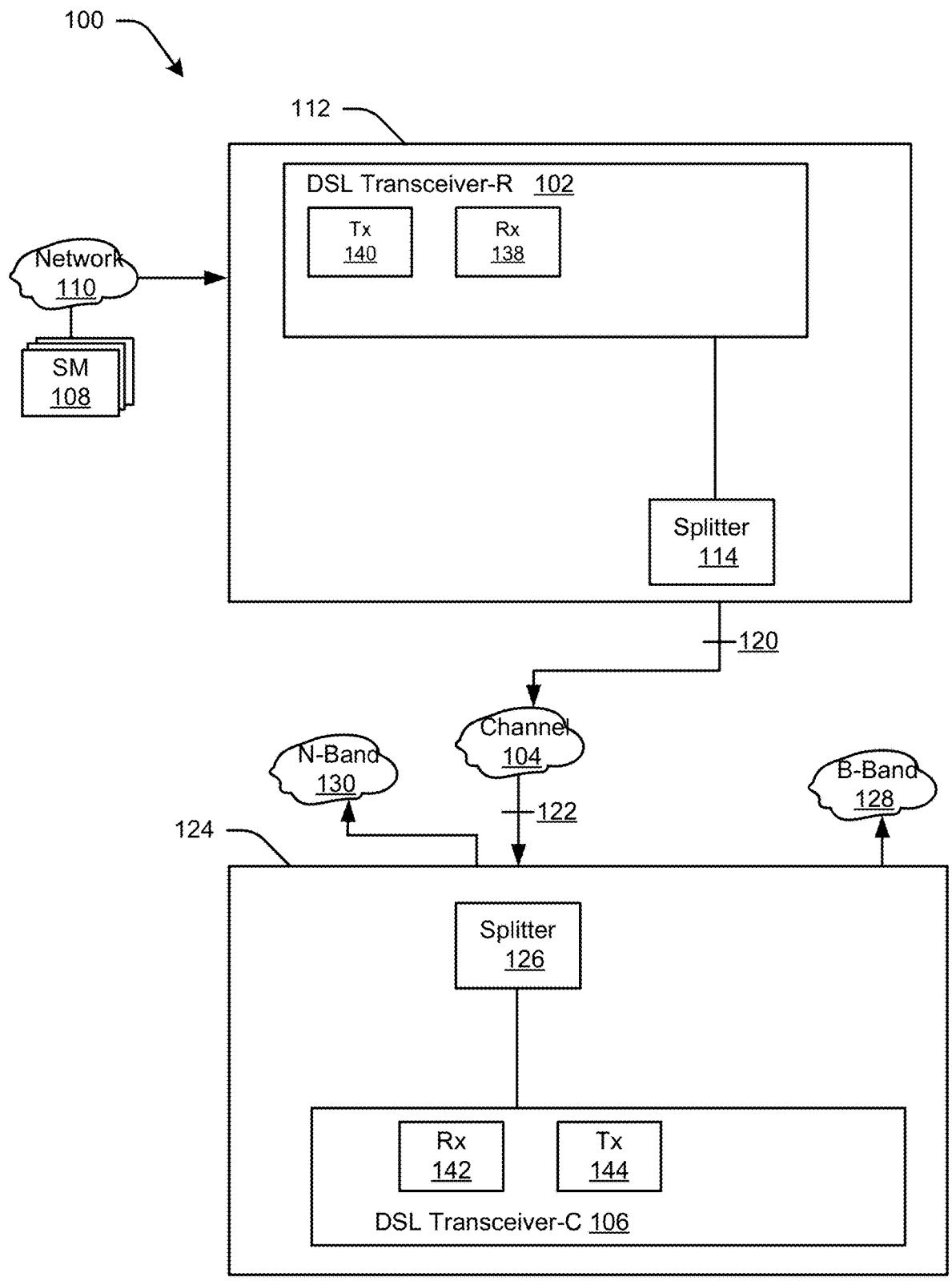
FIG. 1 illustrates a block diagram illustrating an example DSL transceiver system according to various aspects.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (UE) (e.g., mobile/wireless phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

To reduce latency and storage memory required for the LCM systems, and eliminate additional framing synchronization routine(s), various aspects/embodiments enable alignment of the LDPC codewords and DMT symbol boundaries, as well as related techniques of puncturing and shortening for this alignment. Although the current disclosure uses examples of LDPC codewords or LCM scheme, any codeword derived from blocks code in modulation for a parity check is envisioned herein, as LDPC codes are an example of block codes that operating with a number of input bits generating output with parity bits. As such, the aspects/embodiments or principles disclosed and discussed herein can apply to any block code and is not necessarily limited to only one type of block code for example.

xDSL/G.fast systems, for example, can utilize Trellis Coded Modulation (TCM) as an inner code. TCM is a convolutional code, therefore a variable number of constellations can be protected with this code without specific measures. Thus, TCM can be terminated at any point, and current solutions in xDSL/G.fast terminate TCM at the end of DMT every symbol.

Some aspects for LDPC-coded modulation (LCM) can assume no alignment between LDPC codeword and DMT symbol boundaries. These techniques can work for packet-based transmission, such as used in G.hn or WiFi, because the length of the encoded data packet can always be slightly extended or padded to accommodate integer number of LDPC codewords. However, xDSL/G.fast and MGFAST uses continuous transmission (which can be more efficient for point-to-point connections), for which LDPC codewords spanning over the DMT symbol boundaries may result in additional latency, requires more storage memory, and can cause frame synchronization problems, as described above.

In consideration of described deficiencies of DSL communication systems for communication between devices, (e.g., a customer premise equipment (CPE) or user equipment (UE) and a central office, server component, base station or the like), an LCM scheme is proposed that reduces the number of parity bits (puncturing) and data bits (shortening) of LDPC codewords, such that the LDPC codeword boundary is located at, aligned with, or on a DMT symbol boundary. This holds along with the assumption that the number of bits in a DMT symbol is not constant, but rather depends on the used frequency spectrum (according to spectrum management rules) and condition of the particular channel or line (its attenuation and the noise); the latter can vary during the steady-state operation of the line (e.g., while communicating data through DSL at data streaming/show-time).

In particular, the properties of LDPC code can change due to puncturing and shortening operations, while for efficient LCM it is demanded to maintain high coding gain of the LDPC code. The puncturing and shortening scheme proposed herein keeps the coding gain nearly constant for different LDPC codeword sizes.

Further, proposed embodiments/aspects provide interoperability, so that the transmitter and the receiver can seamlessly synchronize with any new setting (e.g., codeword length, number of puncturing bits, or other criteria). Embodiments herein enable this to be done autonomously, i.e., without communicating large amount of information between peer transceivers, by creating simple algorithmic rules that both sides (receiving and transmitting) can use.

In another embodiment, the LDPC code/block code settings such as codeword length and number of puncturing bits can be communicated between transceivers when the data rate changes (e.g., through seamless rate adaptation (SRA) or fast rate adaptation (FRA)).

Aspects/embodiments of the presented scheme(s) and related components can operate to reduce latency and the required storage memory of an LCM scheme. Further, no additional synchronization of LDPC codewords boundaries inside DMT symbols is necessarily required, and LCM processing can be simplified because the physical medium dependent (PMD) sublayer of each can operate on DMT symbol instances (e.g., DMT or OFDM boundaries). Interoperability can be autonomous, based on different algorithmic rules being disclosed herein.

Additional advantages include that alignment between LDPC and symbol boundaries allows for low latency transmission with the LCM scheme and keeps the buffer requirements lower than it is the case without such alignment.

Furthermore, the assignment of parity and data bits on the subcarriers of the DMT symbol and the number of LDPC codewords per DMT symbol can remain static as long as the data rate is not changed. This simplifies the bit mapping operation. As the data rate is changed, a dynamic assignment can also modify the assignment of parity and data bits on the subcarriers of the DMT symbol and the number of LDPC codewords per DMT symbol.

Additional aspects and details of the disclosure are further described below with reference to figures.

In order to provide context for various aspects of the disclosed subject matter, FIG. 1 illustrates a non-limiting example of a communication system comprising computing component(s) 100 that can implement some or all of the aspects or components described herein. FIG. 1 illustrates a block diagram of a digital subscriber line (DSL) transceiver system 100, for example, comprising functional blocks and interfaces that can operate as discrete multi-tone (DMT) or an orthogonal frequency division multiplexing (OFDM) communication components. The DSL transceiver system can include a DSL remote transceiver (Transceiver-R) 102, a channel 104, and a DSL central transceiver (Transceiver-C) 106, for example, or other similar communication component(s). The Transceiver-R 102 can be housed in a DSL modem 112, or other device. The Transceiver-C 106 can be housed in a Digital Subscriber Line Access Multiplexer (DSLAM) 124 located at a central office or in street cabinets in xDSL systems and in distribution points (DPs) in G.fast or MG.fast systems. The DSL transceiver system 100 illustrates a transmission system and method for data transport.

In the DSL transceiver system 100, a DSL circuit connects the Transceiver-R 102 and the Transceiver-C 106 on each end of a twisted-pair telephone line, creating different information channels: a high speed downstream channel, a medium speed duplex channel, and a plain old telephone service (POTS) channel. The POTS channel could be split off from the digital modems by splitters, thus guaranteeing uninterrupted POTS.

The Transceiver-R 102 can be located at a customer's premise as a customer-premises equipment or customer-provided equipment (CPE) or the like, and the Transceiver-C 106 can be located at a telephone company's central office or remote location, such as a street cabinet for xDSL systems and a DP for G.fast. The Transceiver-C 106 can act as a master to some functions of the Transceiver-R 102. In a typical application, transmitter and receiver components will be incorporated into the same device so that each is capable of transmitting and receiving data. As shown, a DSL transmitter 140 and a DSL receiver 142 can be configured to communicate with one another by way of the channel 104.

The Transceiver-R 102 includes a transmitter 140. For ease in describing the DSL transceiver system 100, the detailed description is provided from the perspective of passing information from the transmitter in the Transceiver-R 102 to the receiver in the Transceiver-C 106; however, an analogous analysis process or processes as described herein can occur during to the transmission of information from the Transceiver-C 106 via a transmitter 144 to the Transceiver-R 102 via receiver 138, for example. The DMT modem 112 can also contain a splitter 114 as well as other components.

The input to the Transceiver-R 102 can be a remote network 110. The remote network 110 can include service modules (SMs) 108. The service modules 108 can be personal computers, servers, routers, and many other devices known to those skilled in the art. A standard phone, a voice band facsimile (VB. Fax), and an ISDN device, for example, as well as other communication devices can also be connected to the splitter 114. The splitter 114 contains filters that separate high frequency DSL signals from voice band signals such as the standard phone, the facsimile, and the ISDN device.

The transmitter 140 within the Transceiver-R 102 processes the service modules 108 and remote network 110 signals for transmission to the receiver 142 within the Transceiver-C 106, via the channel 104. The transmitter 140 processing can provide tone ordering for signal-to-noise ratio (SNR) margin equalization as well as generation of a bit loading table (BLT) or bit allocation table (BAT) and other processes according to various embodiments.

The receiver 142 in the DSL Transceiver-C de-processes the communicated signal and passes the de-processed signals to the Broadband (B-Band) Network 128 and the narrowband (N-Band) network 130. The Transceiver-C 106 can be housed in the DSLAM 124 along with a DSLAM splitter 126 and other components. The receiver 142 can be housed in the Transceiver-C 106, and performs functions that determine a tone order used by the DMT Transmitter 140 in tone ordering for SNR margin equalization as well as generation of a bit loading table (BLT) or bit allocation table (BAT) and other processes according to various embodiments.

Figure 2:
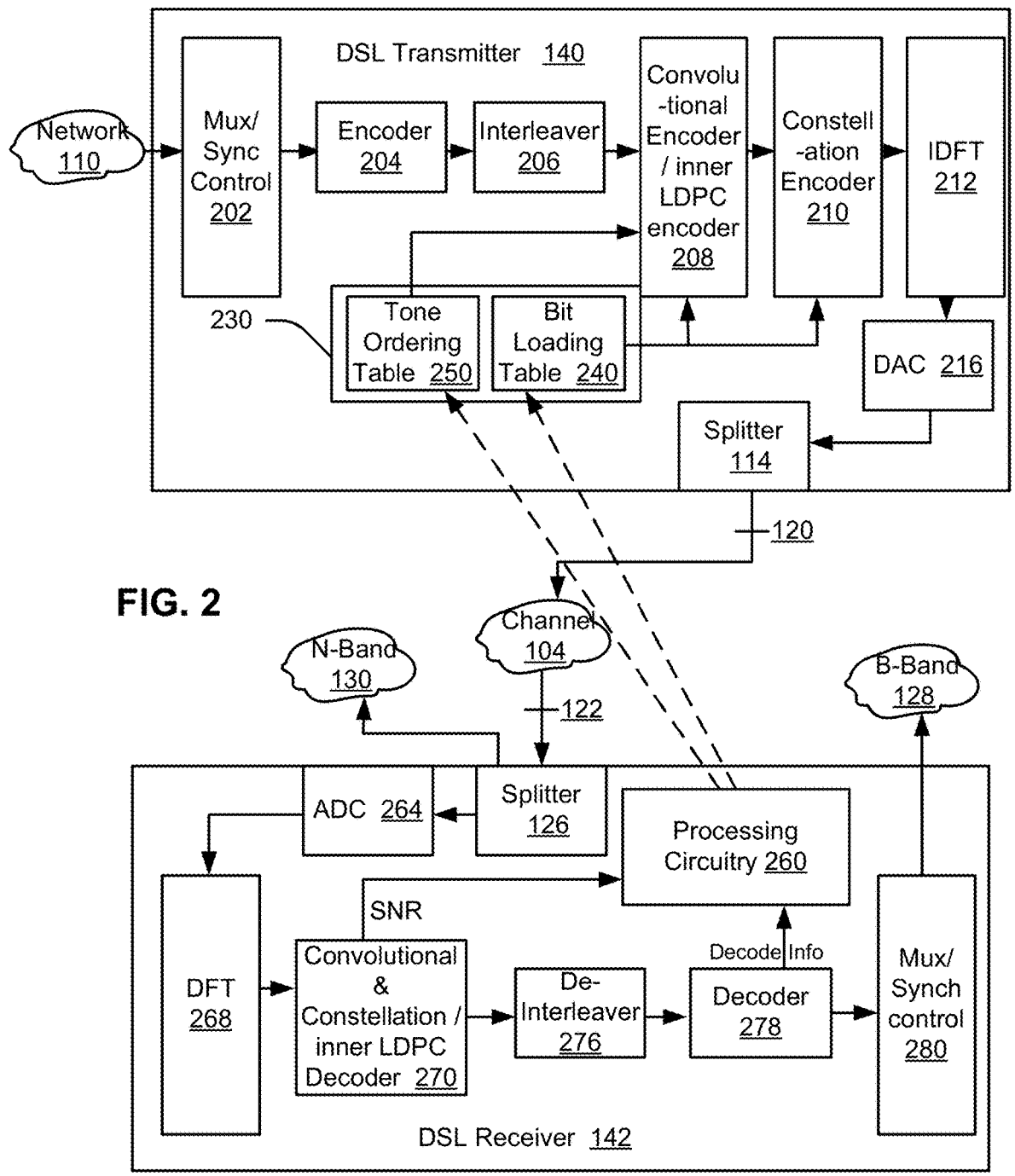
FIG. 2 illustrates a block diagram of an exemplary DSL DMT transmitter and an exemplary DSL DMT receiver according to various aspects.

FIG. 2 is a block diagram of an exemplary DSL transmitter 140 (or 144) that resides in the Transceiver-R 102 and also in the Transceiver-C 106 of FIG. 1, for example. Selected basic functional blocks of the transmitter 140 (or 144) are shown in FIG. 2. It should be noted that the components shown in FIG. 2 are not all required to construct a transmitter. Instead, the components are models for facilitating the construction of DMT signal waveforms, for example. Those waveforms can be constructed in a variety of ways including by hardware, software, and firmware as part of the component(s). The transmitter 140 (or 144) receives input(s) from service modules or remote network(s) 110. A multiplexor synchronous control element (Mux/Sync Control) 202 accepts the inputs and converts the inputs into multiplexed and synchronized data frames (mux data frames). The multiplexer synchronous control component 202 generates the mux data frames at some nominal baud rate.

The binary data stream(s) which is the mux data frame output of the multiplexor synchronous control element 202 passes to convolutional encoder 208 or in the case of LCM an inner LDPC encoder 208 after processing by an encoder 204 that performs forward error correction (FEC) on the binary data stream (e.g., a Reed-Solomon encoder) and outputs codewords as derive from block codes. The FECs are applied in the encoder 204 to the binary data streams without necessarily reference to any framing or symbol synchronizations. Decoding in the receiver 502 can likewise be performed independent of symbol synchronization, for example. An interleaver 206 convolutionally interleaves the codewords output by the encoder 204. The binary data stream is also processed by cyclical redundancy checks (CRCs) that are not shown in FIG. 2. The output of the interleaver 206 can be formatted by the convolutional encoder, or in the case of LCM an inner LDPC encoder 208 into a series of frames generated at the symbol rate. Note that a codeword can span more than one symbol, as an OFDM or DMT symbol.

The convolutional encoder or inner LDPC encoder 208 transforms the data stream from the interleaver 206 into a sequence of tone ordered data frames to be loaded on symbols. The convolutional encoder or inner LDPC encoder 208 first generates additional bits to aid in decoding and adds the additional bits to the bit stream. The convolutional encoder/inner LDPC encoder 208 loads bits from the augmented bitstream into tones based on information stored in a bit loading table 240 and a tone ordering table 250. The bit loading table 240 specifies a number of bits that should be loaded into each tone, based on a noise measure of the channel such as a target signal to noise ratio (SNR) margin, for example. The tone ordering table 250 specifies an order in which tones should be loaded with bits. For example, the convolutional encoder/inner LDPC encoder 208 reads the tone ordering table to determine that the next tone to be loaded is tone number. The convolutional encoder/inner LDPC encoder 208 reads the bit loading table 240 to determine a number of bits that should be loaded onto a particular tone. The convolutional encoder/inner LDPC encoder 208 then loads the next set of bits of the augmented data stream onto the particular tone.

The various elements or components referred to herein as "tables" such as the bit loading table (or bit allocation table (BAT)) 240 and the tone ordering table 250 can be any system, computer program, hardware device, memory element, or logic device that organizes information in a readily retrievable manner. The tone ordering table 250 communicates a specific arrangement of tones into tone groups. The bit loading table 240 specifies number of bits per tone (sub-carrier or carrier). As will be described in more detail below, these tables such as the bit loading table 240 can be determined by processing component/circuitry 260 in the receiver 142 and sent to the transmitter 200 according to various embodiments. The bit loading table 240 is determined, by the receiver 264, with data representing a number of bits to be allocated to each tone or sub-carrier. The convolutional encoder or in the case of LCM an inner LDPC encoder 208 assigns bits from the augmented bitstream to the tones in the order specified by the tone ordering table 250 with the number of bits assigned to them in the bit loading table 240. Likewise, similar operations can be processed or generated via a processing circuitry 230 at the transmitter side as well.

The tone ordered data symbols are passed to a constellation encoder 210. The constellation encoder 210 reads the bit loading of each tone to determine a constellation shape to use. The constellation encoder 210 converts the tone ordered data frames into a set of coordinates of coded constellation points for each of the DMT tones. The constellational encoder 210 can be similar to a Quadrature Amplitude Modulation (QAM) encoder.

The coded constellation points of the DMT tones from the constellation encoder 210 are passed on to an Inverse Discrete Fourier Transformer (IDFT) 212. The IDFT 212 converts these constellation points to output time-domain samples, which are passed to a digital-to-analog converter (DAC) 216. The DAC 216 and associated analog processing blocks (not shown) construct a continuous transmit voltage waveform corresponding to the discrete digital input samples from the IDFT 212. The analog signal passes through the splitter 114 and the loop interface remote terminal end 120 and enters the channel 104.

FIG. 2 also illustrates a block diagram of the exemplary DSL receiver 142 that resides in the Transceiver-R 102 and the Transceiver-C 106 of FIG. 1. The receiver 142 receives an input signal at a splitter 126 from the channel 104 and through the loop interface central office end 122. The signal includes narrowband signals that are split by the splitter 126 and sent to the narrow band network 130. The broadband portion of the signal from the channel 104 is processed by an analog-to-digital (ADC) converter 264 and is demodulated by a Discrete Fourier Transformer (DFT) element 268. The DFT element 268 passes the demodulated signal to a convolutional and constellation decoder or in the case of LCM an inner LDPC decoder 270. The convolutional and constellation decoder/inner LDPC decoder 270 can include a Viterbi decoder. The output bitstream of the convolutional and constellation decoder/inner LDPC decoder 270 is processed by a de-interleaver 276 and FEC decoder 278 (e.g., a Reed-Solomon decoder, or the like). A multiplexor synchronous control element 280 passes the de-interleaved and FEC decoded signal to the broadband network 128. There can be additional components involved in processing signals beyond those shown in the FIGS. 1 and 2.

In one embodiment, the processing circuitry 230 or 260 can operate a modulation scheme for parity check that aligns codeword boundaries with symbol boundaries. For example, an LDPC code modulation (LCM) scheme can reduce the number of parity bits (puncturing) and data bits (shortening) of LDPC codewords, such that the LDPC codeword boundary is located at, aligned with, or on a DMT symbol boundary. This holds along with the assumption that the number of bits in a symbol (e.g., OFDM or DMT symbol) is not constant, but rather depends on the used frequency spectrum (according to spectrum management rules) and condition of the particular channel/line (its attenuation and the noise); the latter can vary during the steady-state operation of the line (e.g., while communicating data through DSL at data streaming/showtime).

In particular, the properties of LDPC code can change due to puncturing and shortening operations, while for efficient LCM it is demanded to maintain a high coding gain of the LDPC code such as with a particular target/threshold coding gain. The puncturing and shortening operations can keep the coding gain nearly constant for different LDPC codeword sizes, especially within those multi-carrier communications that are continuous rather than only packet based.

Although LDPC codes are used for explanation throughout, the embodiments/aspects herein are applicable to block codes overall. LDPC codes are block codes operating on K input bits and generating N=K+R output bits, where K is an integer number of input data bits and R an integer number of parity (redundancy) bits. LDPC codes considered here are systematic codes, and thus, the K data bits appear unchanged in the LDPC codeword after encoding (e.g., by encoder 204), while R parity bits (redundancy bits) are appended to the K data bits. The LDPC code rate r=K/N can be used to determine the number of redundancy bits.

According to embodiments herein, no particular assumption is made on specific settings (parameters) related to the LDPC code, such on a codeword size N, a code rate r, and the coding matrices used. The embodiments herein can be applied to any LDPC code or any other block code.

According to embodiments, the processing circuitry 230, 260 can utilize at least two general methods to dynamically adjust the size of the LDPC code without changing the code matrix, which are puncturing and shortening. With puncturing, the number of redundancy bits R is reduced. At the encoder side (e.g., encoder 204 of transmitter 140), the puncturing operation is performed such that the full encoding is performed, but $N_{puncture}$ bits of the redundancy are not transmitted. The position of these bits shall be known or predefined to the receiver 142. At the receiver 142, those punctured bits can be recovered in the initial decoding iterations (e.g., via decoder 278 as part of or separate to the processing circuitry 260), based on the structure of the LDPC matrix. To allow efficient recovery of puncturing bits, a certain code matrix structure can be utilized. Puncturing in particular increases the code rate due to a smaller number of redundancy bits (resulting in shorter code), and thus, reduces the error correction capabilities of the LDPC code; the coding gain is reduced, too. To avoid reduction of coding gain, the code rate could be recovered, which could be done by reducing the number of data bits K (shortening). This can be taken into account to satisfy target bit/symbol error rate(s). With shortening, the number of data bits K is reduced. At the encoder side (e.g., transmitter 140), the shortening operation can be performed such that the shortening bit positions are filled with zeros prior to complete the LDPC encoding via the encoder 204. After encoding, those bit positions are not transmitted. At the receiver side 142, shortened bits with zeros can be inserted back into the received codeword prior to decoding by decoder 278. Shortening reduces the code rate, which results in higher SNR gain. However, due to the reduced codeword size, the coding gain and gap to capacity can still be reduced. Reducing the number of redundancy bits by puncturing enables bringing the overhead lower, or back to low and restoration of the coding gain and gap to capacity.

Figure 3:
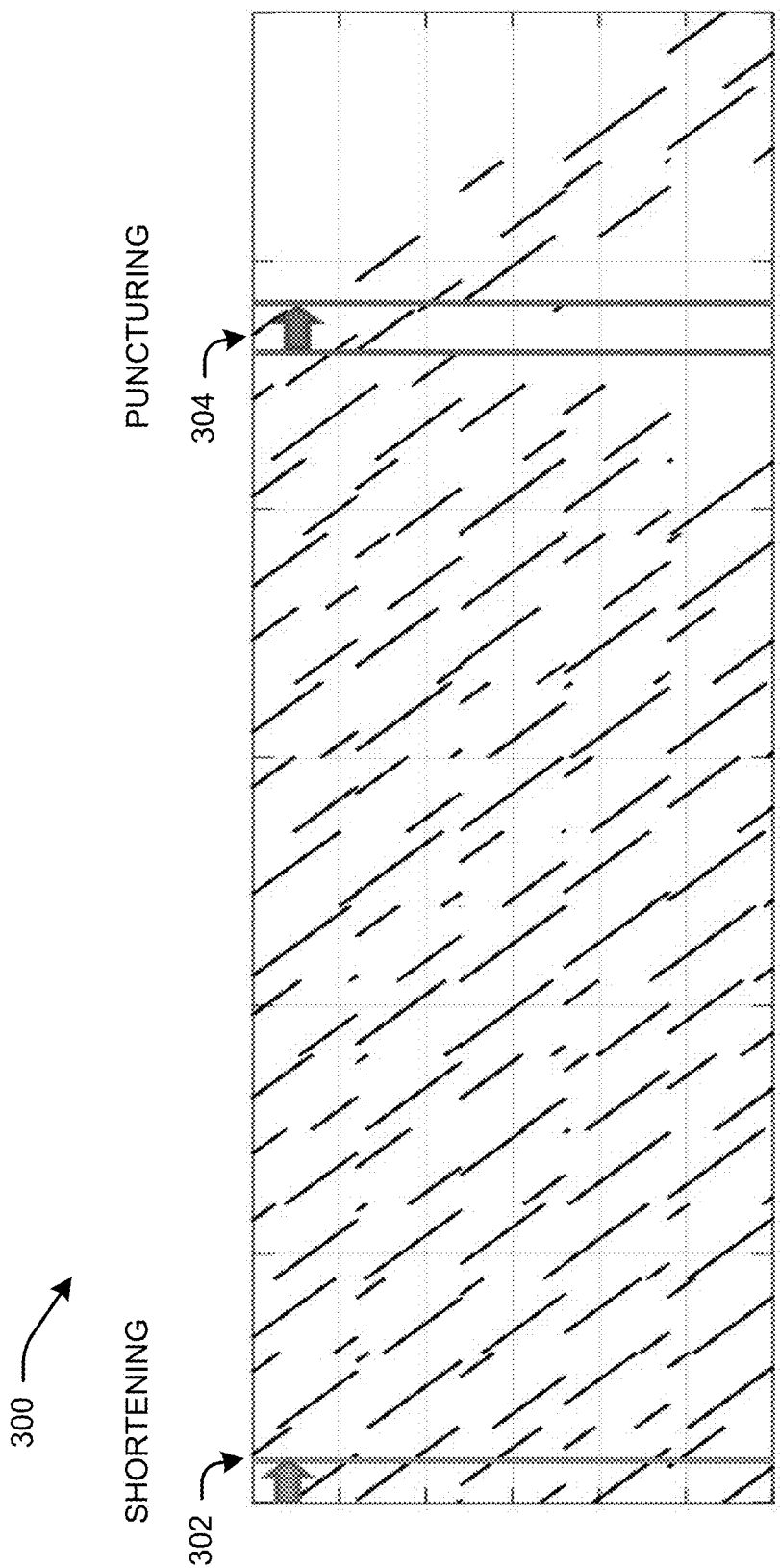
FIG. 3 illustrates an example code structure according to various aspects.

Referring to FIG. 3, illustrated is an example LDPC Code Structure with a rate of ¾ LDPC parity check matrix with 600 bit circulants and N=12000. An example LDPC code matrix structure 300 is shown illustrated, where, for example, the code parameters can be represented as follows: N=12000, K=9000, R=3000 and the code is structured in 600×600 bit blocks ($N_{circulant}$=600); where N represents the codeword size (e.g., LDPC codeword size), K represents a number of input data bits and R can represent a number of parity (redundancy) bits. An LDPC code rate, as indicated above, can be represented as r=K/N, and can be used to determine the number of parity (redundancy) bits R, for example.

In various embodiments, codewords can be aligned with a symbol boundary of symbols based on code setting(s) in a continuous transmission. One or more of a puncturing, a shortening, or circulant size adjustment can be utilized in order to adjust codeword size as a part of the embodiments described herein. This can be done based on a target coding gain to align codeword sizes in the continuous transmission with a symbol boundary. In addition, or alternatively, to puncturing and shortening, a change of a circulant size (Ncirculant) can be utilized by any component herein for encoding/decoding. This circulant size as a cyclic code change can enable LDPC codewords to change their size in large steps (e.g., 12,000 bits to 6,000 bits, and from 6,000 to 3,000, or by another differential), while the code rate remains or is kept about the same.

The number and positions of punctured bits cannot be selected arbitrarily, because the puncturing bit positions are to be recovered during the first iterations (of decoding), and this is done by using the specifics (parameters or settings) of the code structure. For the code structure 300, for example, only the last subset of bits (e.g., 600 bits) can be recovered in the first iteration and then with those bits known, the second last 600 bit block can be recovered.

Due to the mentioned limitations in puncturing 304, the number of punctured bits can be kept constant for certain ranges of a shortened LDPC codeword size (further called effective LDPC codeword size, $N_{eff}$), which can become represented as: $N_{eff}=N-N_{puncture}-N_{shorten}$, where:

$N_{eff}$ represents the actual size of the LDPC codeword number (after puncturing and shortening);

$N_{puncture}$ represents the number of punctured bits;

$N_{shorten}$ is the number of data bits reduced by shortening.

The effective number of information bits and code rate with given shortening and puncturing can be represented as: $K_{eff}=K-N_{shorten}$, and $r_{eff}=K_{eff}/N_{eff}$.

Referring back to FIG. 2, with LDCP coded modulation (LCM) via the processing circuitry 230, 260 or other component, the LDPC parity bits are to be on certain bit positions of the encoded DMT carrier (e.g., on two Least Significant Bits (LSBs) of the Quadrature Amplitude Modulation (QAM) constellation, or other number of LSBs or other position(s)), giving the lower limit to the LDPC code rate to be ½, i.e., min $(K_{eff}/N_{eff})=½$, for example.

The requirement (or constraint) to keep or maintain a certain minimum level of error correction capability can determine an upper limit of the code rate, which is, in turn, can be determined by a noise measure (e.g., a signal to noise ratio (SNR)) that is used to obtain a certain bit per symbol error rate of the shortened 302 and punctured code from shortening 302 and puncturing 304. The highest spectral efficiency (and thus, the smallest SNR gap to capacity (coding gain)) can be achieved with a maximum LDPC codeword size. These parameters or settings as well as others can be used to dynamically align the LDPC codewords and DMT symbols with the boundaries of one another; in which the boundaries can include one or more symbol (OFDM/DMT) boundaries, or a complete transmission frame of symbols, for example.

Depending on the data rate (which is determined by the current number of bits loaded onto a DMT symbol, for example), the LDPC code settings can be adjusted. With the various embodiments, these adjustments may not be communicated between the transmitter and receiver, but derived by each of them using predefined rules from the current bit allocation table (BAT), which can be known at both sides (Tx/Rx) of the line or channel).

The number of LDPC-coded bits per DMT codeword can be represented by: $B_{lcm}=\Sigma_{i=1}^{L} \min(b^{(i)}, b_{lcm})$, where L is a number of carriers in the DMT symbol, $b^{(i)}$ is the QAM constellation size on carrier i and $b_{lcm}$ is the maximum number of LDPC-coded bits per carrier. With an MGFAST settings of L=8000 carriers and $b_{lcm}$=4 and N=12000, for example, a full DMT symbol will carry: a number of codewords $n_{cw}$=ceil(8000·4/12000)=3 codewords, shortened (e.g., to 2×10667 and 1×10666 bit LDPC codewords).

In case of a small number L of used carriers, the total number LDPC-protected bits $B_{lcm}$ per DMT symbol may be smaller than the smallest supported efficient codeword size, $N_{min}$. To facilitate or support this case, the various embodiments herein can use one or more of a few defined discrete fractional values of $n_{cw}$, e.g., $n_{cw}$=½, $n_{cw}$=⅓ and $n_{cw}$=¼.

From a performance optimization perspective, different rules of dividing of the given number of bits to codewords ($B_{lcm}/n_{cw}$) can be used, like maximizing the size of all codewords, while using the minimum size of the last codeword, or using all codewords of roughly the same size, or other size. The any of the various embodiments herein can enable any one of such strategies, where the specifically selected strategy can be predefined to maintain interoperability between peer transceivers autonomously, for example.

Thus, lining up codewords can be generated by taking into account that the size varies by using puncturing and shortening, and also with different rules based on the actual size. When applying LDPC code to any type of modulation, the LDPC code can have a fixed size N, such as 12,000 bits, but other sizes can also be envisioned as some fixed size or fixed number of bits so that when using LDPC code with LDPC, the issue to be considered is this number.

First, data can be sent by a number of symbols, and in each symbol a number of bits can be put into the symbol changes, which depends on the length of the line, the noise of the line and other related factors such that it changes from one line to another. Inside the line it also may change during showtime because, for example, noise conditions may change.

In contrast to a packet communication with some integer number of DMT symbols or OFDM symbols where the number or specific number could be any, there are no limitations there in the case of DSL, G.Fast, or MG.Fast continuous transmissions are utilized. Thus, there is a certain number of symbols per frame that cannot be changed, and thus it happens that the LPDC codeword could spread over a certain number of symbols and never be predicted where it could end, causing a lot of problems, both for implementation, for latency, and synchronization between the frames. As such, there is a benefit to confining this LDPC codeword to one or some group of DMT symbols or OFDM symbols or to a transmission frame to then ensure that the LDPC codeword ends at the end of one of these symbols to align the symbols or ensure alignment.

Embodiments further include selection of various parameters or settings, including a codeword size (e.g., an LDPC codeword size), a number of LDPC codewords (per symbol/carrier/codeword), as well as a number of shortening/puncturing bits, or the like.

There are different embodiments of a rule or condition for how to select the number of LDPC codewords per DMT symbol. For a minimum latency target, for example, it is advantageous to select a largest new that is possible. This case is accommodated by using the rule [1], which addresses the case when LDPC codeword spans over up to 4 DMT symbols (depending on the number of active carriers per DMT symbol):

$$n_{cw} = \begin{cases} \text{ceil}\left(\frac{B_{lcm}}{N}\right) & \text{for } B_{lcm} \geq 2N_{min} \\ \frac{1}{2} & \text{for } N_{min}/2 \leq B_{lcm} < N_{min} \\ \frac{1}{3} & \text{for } N_{min}/3 \leq B_{lcm} < N_{min}/2 \\ \frac{1}{4} & \text{for } B_{lcm} < N_{min}/3 \end{cases} \quad [1]$$

Implementation of this rule requires the minimum allowed LDPC codeword size $N_{min}$ to comply with the condition $N_{min}/N \leq \frac{1}{2}$, which may not be possible with certain types of LDPC codes (because puncturing is limited and reduction of codeword size by shortening is limited as well).

In case of $\frac{1}{2} < N_{min}/N \leq \frac{2}{3}$, the rule [1] can be adjusted according to the rule (condition) [2] below:

$$n_{cw} = \begin{cases} \text{ceil}\left(\frac{B_{lcm}}{N}\right) & \text{for } B_{lcm} \geq 2N_{min} \\ \frac{3}{2} & \text{for } 3N/2 \leq B_{lcm} < 2N_{min} \\ 1 & \text{for } N \leq B_{lcm} < N_{min} \\ \frac{2}{3} & \text{for } 2N_{min}/3 \leq B_{lcm} < N_{min} \\ \frac{1}{2} & \text{for } N_{min}/2 \leq B_{lcm} < 2N_{min}/3 \\ \frac{1}{3} & \text{for } N_{min}/3 \leq B_{lcm} < N_{min}/2 \\ \frac{1}{4} & \text{for } B_{lcm} < N_{min}/3 \end{cases} \quad [2]$$

As an alternative to a minimum latency setting as a target, the setting that maximizes the codeword size, and thus, maximizes the spectral efficiency, could be selected. This setting can be achieved using the following condition or rule [3] for selection of the number of codewords per symbol:

$$n_{cw} = \begin{cases} \text{ceil}\left(\frac{B_{lcm}}{N_{ldpc}}\right) & \text{for } B_{lcm} \geq 3N/2 \\ \frac{3}{2} & \text{for } N \leq B_{lcm} < 3N/2 \\ 1 & \text{for } 2N/3 \leq B_{lcm} < N_{min} \\ \frac{2}{3} & \text{for } N/2 \leq B_{lcm} < 2N/3 \\ \frac{1}{2} & \text{for } N/3 \leq B_{lcm} < 2N/2 \\ \frac{1}{3} & \text{for } N/4 \leq B_{lcm} < N/3 \\ \frac{1}{4} & \text{for } B_{lcm} < N/4 \end{cases} \quad [3]$$

In another embodiment, the LDPC codeword boundaries are aligned with the transmission frame, which contains M consequent DMT symbol positions (with no gaps) followed by a number of gaps (empty symbol positions) (e.g., with the upstream and downstream interval boundaries in case of time division duplexing (TDD)). To avoid issues with frame synchronization, as described above, it is sufficient that LDPC codewords are not spread over the boundary between two frames. This is simpler than confining an integer number of LDPC codewords in one or few (1, 2, 3, or 4) DMT symbols. Thus, the rule for selection simplifies to [4] as represented below:

$$n_{cw,frame} = \text{ceil}\left(\frac{M \times B_{lcm}}{N}\right) \quad [4]$$

The representative rules, conditions or Equations [1]-[4] define a number of possible cases by which to confine integer number of LDPC codewords to integer number of DMT symbols, such as: —multiple LDPC codewords being fit to one DMT symbol (e.g., 3 LDPC codewords in one DMT symbol); —or fit to a small group of DMT symbols, e.g., 3 LDPC codewords fit to one, two, or three DMT symbols); —or fit to a big group of DMT symbols, like entire transmission frame (e.g., 43 LDPC codewords in a transmission frame of M=20 symbols).

For the presented above cases, it may not be possible to achieve a setting where all LDPC codewords have exactly the same number of bits $N_{eff}$. There are values of $B_{lcm}$ where at least 1 bit difference between the size of the LDPC codewords can be utilized or required. In an aspect, some of the following similar rules can be used to determine how to obtain all of the codewords having the same length, or approximately the same length:

A. In case $B_{lcm} \text{ mod}(n_{cw})=0$, all codewords shall have the same length that is equal to: $N_{eff}=B_{lcm}/n_{cw}$;

B. In other cases, the first $B_{lcm}\text{mod}(n_{cw})$ codewords will have the length $N_{eff}=\text{ceil}(B_{lcm}/n_{cw})$ and the remaining codewords will have the length $N_{eff}=\text{floor}(B_{lcm}/n_{cw})$.

In the case where an integer number of LDPC codewords is confined to a M-symbol transmission frame, rules (e.g., A, B, etc.) could use ($M \times B_{lcm}$) instead of $B_{lcm}$ and $n_{cw,frame}$ instead of $n_{cw}$.

In some cases performance may be improved by using codewords of unequal size. In one embodiment, the following rule can be used: C. The size of one codeword (e.g., usually, the last one) is kept equal to or greater than $N_{min}$, while the size of all other $n_{cw}-1$ codewords is maximized or increased.

Rule C is expected to be efficient in case when integer number of LDPC codewords is confined to a transmission frame. For instance, for a M-symbol transmission frame having ($M \times B_{lcm}$) encoded bits and $n_{cw,frame}$ codewords, the Rule 3 can be implemented as follows: for all codewords, except the last one:

$$N_{eff} = \text{floor}\left(\frac{M \times B_{lcm} - N_{min}}{n_{cw,frame} - 1}\right);$$

for the last codeword: $N_{eff-last} = M \times B_{lcm} - N_{eff} \times (n_{cw,frame} - 1)$.

Figure 4:
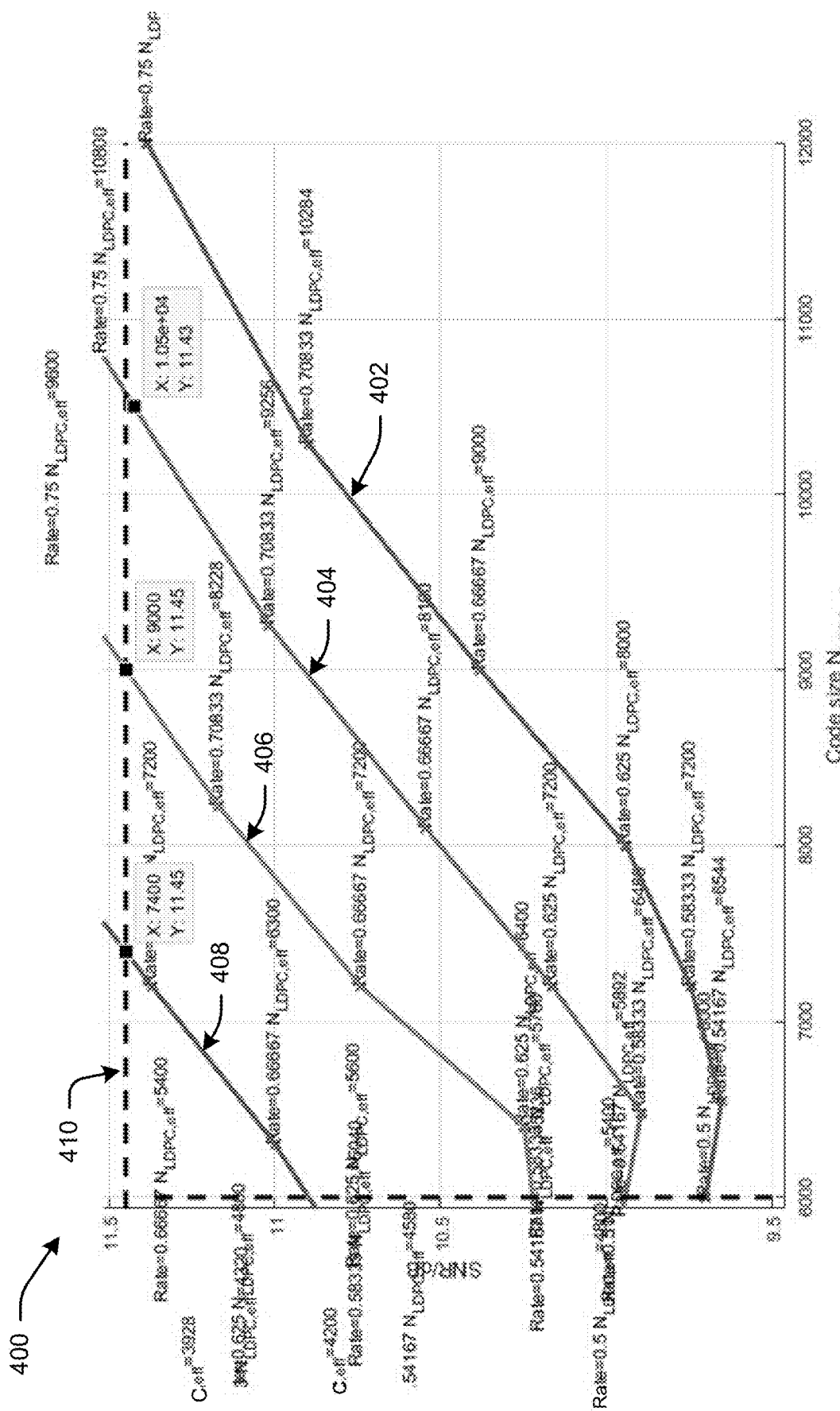
FIG. 4 illustrates example graph of curves for selection of settings to achieve target error rate according to various aspects or embodiments being disclosed.

Other embodiments can include a selection of puncturing, shortening, related parameters or a combination thereof. With obtained effective LDPC codeword size $N_{eff}$, the number of puncturing and shortening bits to achieve this LDPC codeword size can further be selected according to certain rules or conditions as well. The rules can be based on puncturing rules, which can largely depend on a particular LDPC code matrix, and are derived such that, despite puncturing and shortening, the LDPC code still operates with high coding gain or a selected target coding gain. The resulting coding gain can also depend on the decoding strategy used by the receiver (e.g., 142) for a particular number of punctured bits. Considering hardware implementation, it is usually desirable to have a limited number of discrete values for the puncturing to simplify reconstruction of punctured bits. Referring to FIG. 4, for instance, is an SNR versus effective codeword size graph (for selection of LDPC settings) where each line can represent one puncturing setting of 0 bit for curve 402, 300 bit for curve 404, 600 bit for curve 406, 900 bit for curve 408, and 1200 bit, for example.

As the bit allocation is done under the assumption of a certain coding gain of the LDPC code, only codes achieving the assumed minimum coding gain or a higher coding gain satisfying a target threshold could be accepted. This limits the available settings to select as well.

Furthermore, the settings that achieve the desired codeword size (using both puncturing and shortening) with the highest code rate, while keeping the symbol error rate below the desired target symbol error rate for the target SNR (upper dashed line in FIG. 4) is in many cases the most efficient choice. The rule implementing this principle is presented FIG. 4, which shows how to select puncturing and shortening for each size of the codeword $N_{eff}$ for the LDPC code under investigation by the processing circuitry 230, 260, for example.

The four cures in FIG. 4 illustrate as an example the SNR required to achieve the target symbol error rate of $10^{-4}$, other rates could also be implemented. The used puncturing is 0 bits for the curve 402, 300 bits for the curve 404, 600 bits for the curve 406, and 900 bits for the curve 408. The rest of codeword size reduction from the nominal value of 12000 bits is achieved by shortening. The horizontal dashed line 410 is SNR=11.45 dB, which can be used as a target SNR. With this target SNR, the selected puncturing for a given codeword size would be given by the following:

$N_{puncture}=0$ for $10500 \leq N_{eff} < 12000$; $N_{puncture}=300$ for $9000 \leq N_{eff} < 10050$; $N_{puncture}=600$ for $7400 \leq N_{eff} < 9000$; $N_{puncture}=900$ for $6000 \leq N_{eff} \leq 7400$.

The number of data bits $K_{eff}$ of the codeword is given by $K_{eff}=N_{eff}-(N-N_{puncture})$ as eqn [5]; and the number of shortening bits is: $N_{shorten}=K-K_{eff}$ as eqn. [6].

With more allowed puncturing settings, the coding gain can be kept in a more narrow range, which can give an even higher efficiency.

Figure 5:
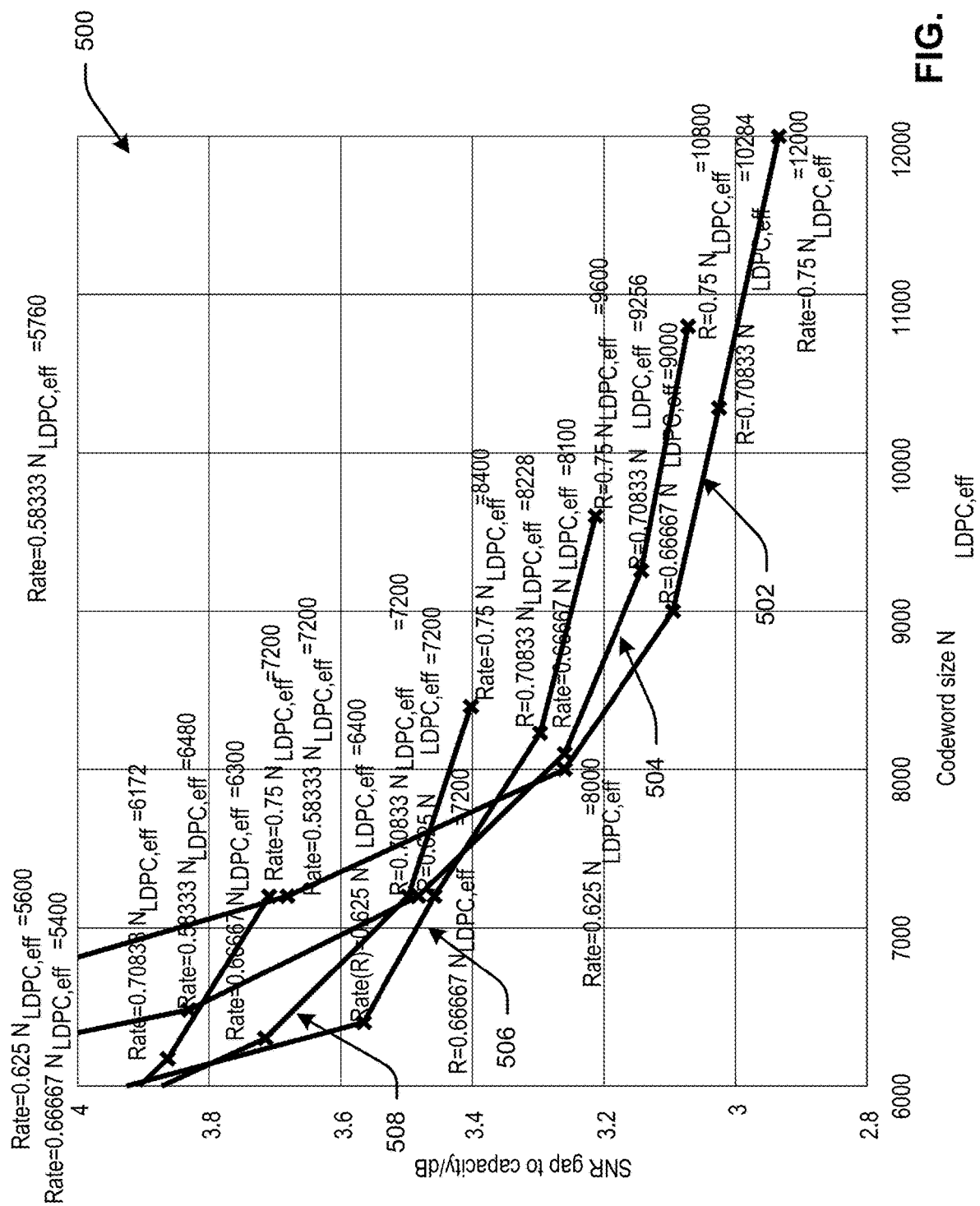
FIG. 5 illustrates example graph of curves for selection of settings to achieve target coding gain according to various aspects or embodiments being disclosed.

Alternatively, or additionally, FIG. 5 illustrates a graph 500 for selection of code settings based on SNR gap to capacity (coding gain) or a target coding gain according to embodiments. Similar to FIG. 5, the graph 500 can be used to build a rule or conditions for selection of the number of puncturing bits. For the particular case presented in FIG. 5, the range of effective codeword sizes that correspond to the same as above number of punctured bits can be selected to obtain minimum SNR gap to capacity: curve 502 can comprise settings $N_{puncture}=0$ for $7900 \leq N_{eff} < 12000$; curve 504 can comprise settings $N_{puncture}=300$ for $7500 \leq N_{eff} < 7900$; curve 506 can comprise settings $N_{puncture}=600$ for $6200 \leq N_{eff} < 7500$; and curve 508 include $N_{puncture}=900$ for $6000 \leq N_{eff} \leq 6200$. The obtained $N_{eff}$ ranges are different from those derived above in FIG. 4, which is because of different selection criterion. Other selection criteria and, respectively, other rules determining puncturing vs shortening are also possible in the framework of this disclosure.

In particular, a codeword size can start at 12,000, for example. As the codeword decreases in size down to 6,000, as a result of shortening and puncturing, the SNR gap to capacity (coding gain) increases. Comparing the lowest coding gain at 12,000 with the highest one, which is at about 6,000, a difference of almost 1 dB is observed. Thus, depending on a target coding gain, the transmitting or receiving device can determine the constraints in codeword size to effectively generate codewords. So by this graph, the processing circuitry 230, 260 or a predefined setting can actually determine or configure what the Nmin is for any setting of shortening and puncturing.

After selecting or configuring Nmin, then an integer number of codewords in an integer number of symbols can be derived. Then the above equations can be used to select or configure settings such as the values for Blcm, the number of bits that need to be encoded in total, and the Nmin (e.g., from rules/equations 1 or 2, or otherwise).

In another embodiment two or more code matrices are supported and, based on the required code size $N_{eff}$, one or the other code matrix with $N \leq N_{eff}$ can be selected. The effective codeword length $N_{eff}$ for each nominal codeword sizes N associated with a particular code matrix can be achieved using the same rules/equations above.

To provide interoperability between peer transceivers, the same settings for puncturing and shortening are at both sides (e.g., transmitter 140, receiver 142) of the line or channel 104. In the framework of this disclosure according to the various embodiments, two types of settings are further identified: autonomous settings and peer-initiated settings.

In embodiment(s) with autonomous settings, the peer transceivers select the codeword size and the number of bits for puncturing and shortening based on pre-defined rules. With peer-initiated settings, one transceiver selects the codeword settings and communicates these settings to its peer, and then both transceivers operate using the new settings. In both cases, a synchronization command can be configured (e.g., by sync control 202, processing circuitry or other component) used to indicate that both sides switch to the new LDPC codeword settings starting from a particular DMT symbol or particular LDPC codeword. The first choice is usually more practical and in one embodiment this DMT symbol is the first symbol of the transmission frame. The synchronization command can be sent over a robust management channel (RMC).

With respect to autonomous settings, a bit allocation table (BAT, also called bit loading table, BLT) corresponding to the new LDPC code settings is obtained by both transceivers before. With the BAT available, each transceiver computes the value of $B_{lcm}$ and the codeword size $n_{cw}$ (or $n_{cw,frame}$), as defined in equations [1]/[2] or in [3], or in [4]. The rules for how to obtain the number of LDPC codewords can be predefined and thus can be used by peer transceivers autonomously.

Further, using rules 1, 2, or rule 3, depending on the selected case, both transceivers determine the size of the codewords ($N_{eff}$) to be used in each DMT symbol, in a small group of DMT symbols, or in the transmission frame, respectively. By another predefined rule, such as described for a particular number of bits to be punctured, the receiver 142 can autonomously derive the necessary puncturing and shortening applied by the peer transmitter. One of the pre-defined rules for selection of puncturing, such as described, can be used to obtain the number of punctured bits selected, and then shortening can be determined using equation [6].

In summary, since pre-defined rules could be used to ensure alignment at all steps of the procedure, both sides can determine the codeword settings autonomously, based on the BAT and the number of encoded bits per subcarrier, $b_{lcm}$. The new code settings are applied by both transceivers at the time when new BAT is activated, thus a synchronization command that activates the BAT automatically synchronizes new codeword settings.

In embodiment(s) with peer-initiated settings, the rules for selection the number of codewords (equations [1]/[2],

[3], or [4]) for alignment, as well as rules for selection of the codeword size (rules 1, 2 or 3) and rule for selection the number of punctured bits are done by one transceiver 112 and communicated to the peer transceiver 124 as a part of line configuration or re-configuration procedure. The peer transceiver, in this case, has no intelligence, but can still compute shortening using equation [6]. For example, this can be done when initiation is done by the receiver 142, because the receiver 142 can more often determine the BAT, based on the associated SNR measurements. In DSL systems, this update of the BAT can be implemented by procedures such as Seamless Rate Adaptation (SRA) or Fast Rate Adaptation (FRA). The receiver 142 also performs LDPC decoding (e.g., at decoder 278), therefore it can optimize also the requested number of punctured bits, based on the applied by the vendor decoding algorithms.

In the framework of this disclosure, initiation can alternatively or additionally be done by the transmitter 140 as well for alignment.

Figure 6:
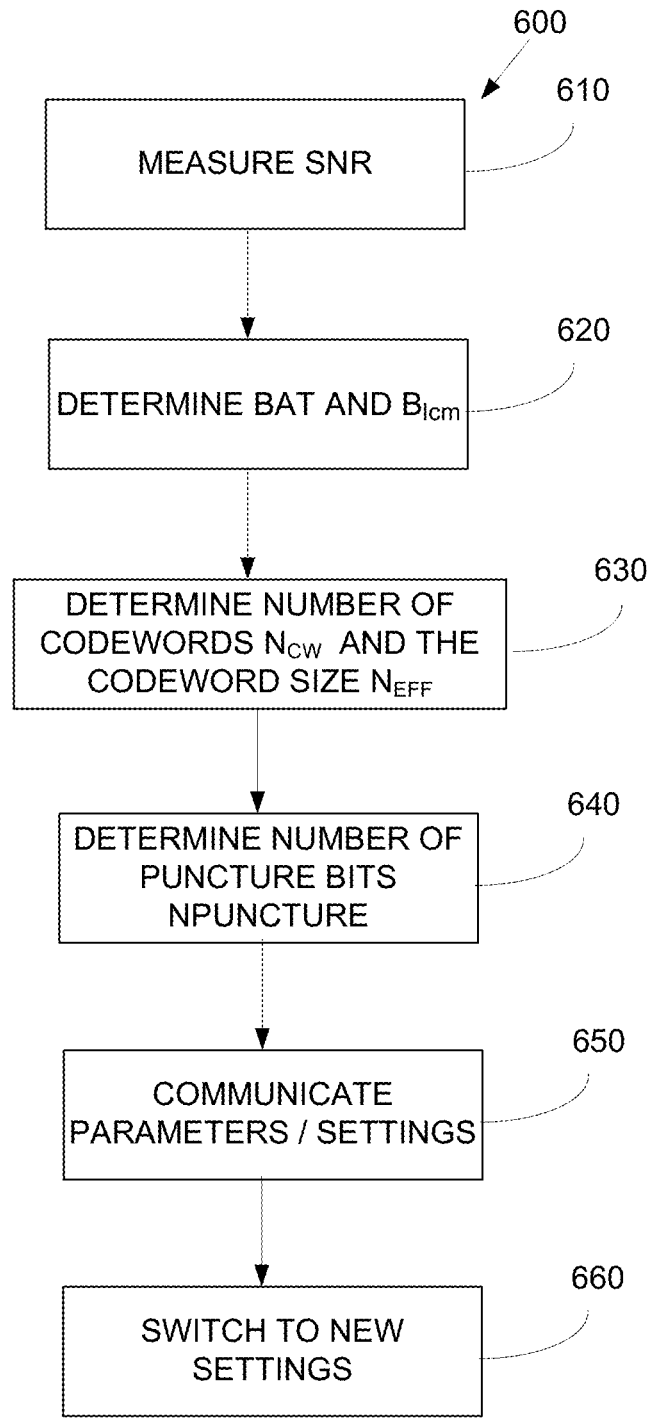
FIG. 6 illustrates an example process flow for receiver-initiated settings codeword settings according to various aspects.

FIG. 6 illustrates an example process flow 600 for receiver-initiated LDPC codeword setting to ensure alignment of codewords with one or more symbol boundaries.

At 610, the receiver-initiated setting of LDPC codeword is performed by the process flow 600 initiating with estimation or measure of the SNR per carrier (e.g., DMT carrier).

Then at 620, the receiver, after estimation of the SNR per DMT carrier, determines the BAT and computes the number of encoded bits per codeword (e.g., the $B_{lcm}$).

At 630, with the obtained Blcm, the receiver (e.g., 142) determines the number of codewords $n_{cw}$ (or $n_{cw,frame}$) and the size of each codeword $N_{eff}$. The selection of the rule for $n_{cw}$ (among equations [1]/[2], or [3], or [4]) and the rule for $N_{eff}$ (among rules A/B or C) can be based on the choice of the management system or be vendor-discretionary.

At 640, with the obtained $N_{eff}$, the receiver determines $N_{puncture}$ using either predefined or a vendor-discretionary rule so that the selection could maintain a high coding gain or target coding gain of the punctured/shortened code.

At 650, the receiver 142 communicates all the obtained relevant parameters/settings, including BAT, $N_{eff}$, $N_{puncture}$) to the transmitter 140; the transmitter 140 acknowledges reception of the parameters (settings) by sending a synchronization command, which indicates the time instant (usually a particular DMT symbol) starting from which the new parameters should be applied.

At 660, both peer transceivers switch to the new settings at the indicated time instant. In some embodiments, the acknowledgement from the transmitter can be separated from the synchronization command.

Puncturing herein can be determined by the receiver, while for a given number puncturing bits as determined by embodiments herein, shortening can have one possibility and thus not necessarily communicated. This can hold true in the case that the circulant size is changed in addition to puncturing and shortening, for example.

In another embodiment, the termination of the codeword can be at an end of a DMT symbol. Termination at a boundary of a plurality of DMT symbols can also include the case where termination is at an end of the DMT symbol.

Alternatively, or additionally, transmitter-initiated codeword setting is very similar to the receiver initiated codeword setting procedure, but it can start only after the updated BAT is available at both sides (so, the transmitter can compute the required puncturing and shortening). Therefore, use of transmitter-initiated procedure substantially delays the overall line reconfiguration. Besides, it may result in sub-optimal selection of puncturing because transmitter is unaware of particular decoding algorithms used by the receiver.

In some embodiments, a robust management channel (RMC) is transmitted on dedicated carriers of certain DMT symbols, for example. Those symbols, also called RMC symbols, carry less data bits. In the case that $B_{lcm}$ remains unchanged for RMC and data symbols, e.g., because the RMC data is protected by the same LDPC code, the same LDPC codeword size works for both RMC and data symbols.

Otherwise, when $B_{lcm,mmc} \neq B_{lcm}$, the LDPC codeword size that fits the RMC symbol (or a group of symbols containing data and RMC symbols) may be different from one that fits the regular data symbol (or a group of regular data symbols). The number of LDPC codewords fitting the RMC symbol in this case can be computed by the processing circuitry as follows:

$$n_{cw,rmc} = \begin{cases} \text{ceil}\left(\frac{B_{lcm,rmc}}{N}\right) & \text{for } B_{lcm,rmc} \geq N_{min} \\ \frac{1}{2} & \text{for } N_{min} \leq B_{lcm} + B_{lcm,rmc} + < 2N_{min} \\ \frac{1}{3} & \text{for } N_{min} \leq 2B_{lcm} + B_{lcm,rmc} < 3N_{min}/2 \\ \frac{1}{4} & \text{for } 2B_{lcm} + B_{lcm,rms} < N_{min}/3 \end{cases}$$

Similarly, in the case where the LDPC codeword boundaries are aligned with the transmission frame, each transmission frame can contain the same number of bits in the RMC symbol, which is considered accordingly when calculating the number of LDPC codewords per transmission frame. Assuming one RMC symbol per frame with the number of LDPC coded bits $B_{lcm,mmc}$, the following is obtained:

$$n_{cw,frame} = \text{ceil}\left(\frac{(M-1) \times B_{lcm} + B_{lcm,rmc}}{N}\right).$$

In other embodiments, a full duplex mode of operation and a discontinuous mode of operation can be implemented. In full duplex mode, the transmission frame can be divided into two parts: the downstream priority sub-frame (FDS) and the upstream priority subframe (FUS). The bit loading tables (BATs) associated with FDS and FUS can be different due to different noise conditions, thus there are BATs: one for FDS and one for FUS.

Similarly, with discontinuous operation, there are two time intervals within the transmission frame: the normal operation interval (NOI) and discontinuous operation interval (DOI). The bit loading of the DMT carriers using NOI and DOI can be different, and thus the BATs for NOI and DOI are different as well, similarly to the case of FDS and FUS.

In case LDPC codeword is confined within a DMT symbol or it spans over multiple DMT symbols, but the LDPC codeword boundaries are aligned with the NOI/DOI boundary or the FDS/FUS boundary, no action is required comparing with the regular case described above, except the number of codewords per DMT symbol during FDS and FUS will be different ($n_{sw,FDS}$ and $n_{sw,FUS}$) and during NOI and DOI will be different ($n_{sw,NOI}$ and $n_{sw,DOI}$).

In case that this is not possible, then there is a third case of $n_{cw,FDS\text{-}FUS}$ of the symbol group between FDS and FUS, and respectively, the third case of $n_{cw,NOI\text{-}DOI}$ of the symbol group between NOI and DOI. Since the number of symbols in FDS/FUS and in NOI/DOI are known at both sides of the line, both transceivers can autonomously determine the codeword sizes associated with FDS/FUS or with NOI/DOI, and also those associated with the transition between FDS and FUS and with NOI and DOI, if applicable.

Figure 7:
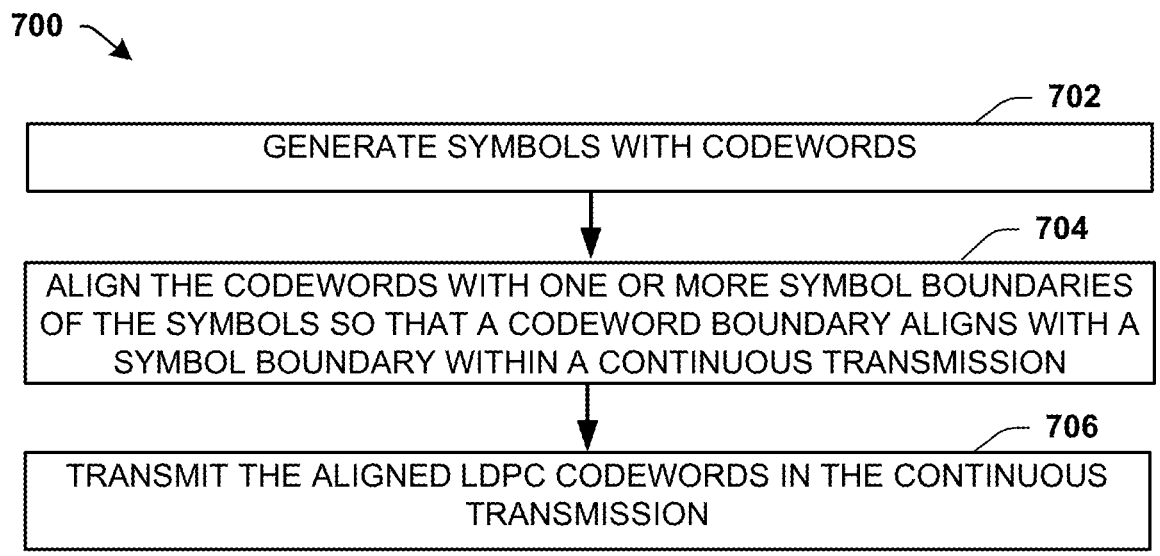
FIG. 7 illustrates an example process flow for aligning codewords with symbol boundaries in continuous communications of a DSL according to various aspects.

Referring to FIG. 7, illustrated is another example process flow 700 for one or more processors of a DSL device to perform operations for multi-carrier communications with alignment of codewords from block code with symbol boundaries of OFDM or DMT symbols.

At 702, the process flow 700 initiates by generating symbols with low-density parity-check (LDPC) codewords that enable LDPC coded modulation (LCM). Other block codes could also be generated alternatively.

At 704, the process flow 700 can include aligning the LDPC codewords with one or more symbol boundaries of the symbols so that an LDPC codeword boundary aligns with a symbol boundary within a continuous transmission for the multi-carrier communications.

At 706, the process flow 700 can include transmitting the aligned LDPC codewords in the continuous transmission, wherein a number of bits varies among the symbols.

The process flow 700 can also include maintaining a substantially constant coding gain from among different transmissions for different LDPC codeword sizes, as well as synchronizing one or more LDPC code settings with a receiver or a transmitter in response to a peer device selecting a different LPDC setting comprising a codeword length or a number of puncturing bits for a different data rate.

As used herein, the term "circuitry" can refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry can be implemented in, or functions associated with the circuitry can be implemented by, one or more software or firmware modules. In some embodiments, circuitry can include logic, at least partially operable in hardware.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor can also be implemented as a combination of computing processing units.

In the subject specification, terms such as "store," "data store," data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in a memory, non-volatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Other examples of the various aspects/embodiments herein can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

A first example is an apparatus employed in a digital subscriber line (DSL) network comprising: processing circuitry, comprising a memory with executable instructions, configured to: generate a plurality of symbols of multi-carrier communications that comprises frames in a continuous transmission and codewords derived from block codes to enable a modulation for a parity check; and align the codewords with a symbol boundary of the plurality of symbols based on one or more code settings; a DSL interface, configured to provide, to communication circuitry, data for a transmission of the plurality of symbols, wherein the plurality of symbols comprises discrete multi-tone (DMT) symbols or orthogonal frequency-division multiplexing (OFDM) symbols.

A second example can include the first example, wherein the processing circuitry is further configured to: generate at least one of: a puncturing of parity bits, a shortening of data bits, or a change in circulant size related to the codewords based on a target coding gain or code rate to align codeword sizes of the codewords with the symbol boundary of the plurality of symbols by varying a codeword size.

A third example can include the first or second example, wherein the DSL interface is further configured to: determine the one or more code settings comprising at least one of: a codeword size, a number of puncturing bits, or a number of encoded bits per codeword.

A fourth example can include any one of the first through third examples, wherein the DSL interface is further configured to: modify the one or more code settings in response to a change in a data rate of a channel or line of the DSL interface, wherein the one or more code settings comprise at least one of: a codeword size, a number of puncturing bits, or a number of codewords per frame/subset of the plurality of symbols.

A fifth example can include any one of the first through fourth examples, wherein the processing circuitry is further configured to: determine a number of codewords per subset of the plurality of symbols or per frame of the continuous transmission based on a first set of conditions in response to a codeword spanning over up to four symbols, based on a second set of conditions in response to the codeword satisfying a defined threshold codeword size.

A sixth example can include any one of the first through fifth examples, wherein the processing circuitry is further configured to: select a number of LDCP codewords per DMT symbol of the plurality of symbols based on a number of consequent DMT symbol positions from one symbol up to a frame of symbols in order to align the LDCP codewords with the symbol boundary of the plurality of symbols.

A seventh example can include any one of the first through sixth examples, wherein the processing circuitry is further configured to: select a number of codewords per subset of the plurality of symbols based on a set of rules or conditions according to one or more of: a number of encoded bits per codeword or a codeword size.

An eighth example can include any one of the first through seventh examples, wherein the processing circuitry is further configured to: in response to a ratio of a minimum codeword size being greater than a threshold ratio, modify a selection of a number of codewords per symbol from among a first set of conditions to a second set of conditions.

A ninth example can include any one of the first through eighth examples, wherein the codewords comprise unequal sizes, and the processing circuitry is further configured to: maintain a size of at least one codeword equal to or greater than a minimum codeword size, while increasing or maximizing a size of other codewords of the transmission.

A tenth example can include any one of the first through ninth examples, wherein the processing circuitry is further configured to: in response to estimating a noise per DMT carrier, determine a bit allocation table, and compute a number of encoded bits per DMT codeword; determine a number of codewords per subset of symbols or a frame of symbols, and a codeword size; determine a number of puncturing bits based on a target coding gain; communicate the bit allocation table, the codeword size and the number of puncturing bits with a time instant for activation; and activate the bit allocation table at the time instant.

An eleventh example can include any one of the first through tenth examples, wherein a number of bits in a symbol of the plurality of symbols varies based on a frequency of the multi-carrier communications and a noise condition of a channel, and wherein the continuous transmission is based on at least one of: an xDSL, a G.fast or an MG FAST standard specification for the codewords, and one or more of the codewords span across one or more of the plurality of symbols.

A twelfth example can be a system employed in a digital subscriber line (DSL) network comprising: processing circuitry, comprising a memory with executable instructions, configured to: process multi-carrier communications comprising a plurality of discrete multi-tone (DMT) symbols; and align low-density parity-check (LDPC) codewords with one or more DMT symbol boundaries of the plurality of DMT symbols in the multicarrier communications based on a set of settings for puncturing a number of parity bits and shortening a number of data bits of the LDPC codewords; a DSL interface, configured to provide, to communication circuitry, data for a transmission of the DMT symbols.

A thirteenth example can include the twelfth example, wherein the processing circuitry is further configured to confine one or more LDPC codewords to one or more DMT symbols of the plurality of DMT symbols or to a transmission frame based on a target code rate.

A fourteenth example can include any one of the twelfth through the thirteenth examples, wherein the processing circuitry is further configured to generate the LDPC codewords comprising same sizes based on a defined number of LDPC coded bits per carrier, or of unequal sizes by keeping a size of at least one codeword equal to or greater than a minimum LDPC codeword size $N_{min}$ and maximizing a size of other $n_{cw}-1$ codewords of the LDPC codewords to be greater in size than the minimum LDPC codeword size.

A fifteenth example can include any one of the twelfth through the fourteenth examples, wherein the processing circuitry is further configured to: generate the LDPC codewords comprising a codeword size by puncturing the number of parity bits and shortening the number of data bits by selecting different LDPC code settings that include one or more of: a target signal to noise ratio (SNR), a symbol error rate, a number of shortening bits, or a number of puncturing bits based on a target coding gain.

A sixteenth example can include any one of the twelfth through the fourteenth examples, wherein the processing circuitry is further configured to: implement the selected settings between a receiver and a transmitter devices based on at least one of: a bit allocation table or a number of encoded bits per subcarrier, being synchronized autonomously or by a peer initiated re-configuration and communication therebetween by either the transmitter or the receiver initially.

A seventeenth example can include any one of the twelfth through the fifteenth examples, wherein the processing circuitry is further configured to: align the LDPC codewords to the one or more DMT symbols in a continuous transmission, or to a full transmission frame of DMT symbols by aligning ends of the LDPC codewords at an end of the one or more DMT symbols or the full transmission frame by configuring the puncturing or the shortening based on a target coding gain.

An eighteenth example can include any one of the twelfth through the sixteenth examples, wherein the processing circuitry is further configured to: generate robust management control (RMC) symbols and data symbols with a same number of LDPC coded bits per DMT codeword as the LDPC codewords; or determine a number of LDPC codewords aligning with one or more RMC symbols when the RMC symbols and the data symbols do not comprise the same number of LDPC coded bits per DMT codeword based on a different set of rules for selecting the number of LDPC codewords than for the data symbols.

A nineteenth example can include any one of the twelfth through the fourteenth examples, wherein the processing circuitry is further configured to: generate different bit loading tables (BATs) associated with a full-duplex downstream priority sub-frame (FDS) and a full-duplex upstream priority sub-frame (FUS), or associated with a normal operation interval (NOI) of a discontinuous operation and a discontinuous operation interval (DOI) of the discontinuous operation, wherein the FDS and the FUS, or the NOI and the DOI, utilize a different number of codewords per symbol; and in response to one or more of the LPDC codewords being spread over more than one symbol of the symbols, use another number of codewords for a group of symbols on a downstream boundary and an upstream boundary.

A twentieth example can be a computer readable storage medium storing executable instructions that, in response to execution, cause one or more processors of a DSL device to perform operations for multi-carrier communications, the operations comprising: generating symbols with low-density parity-check (LDPC) codewords that enable LDPC coded modulation (LCM); aligning the LDPC codewords with one or more symbol boundaries of the symbols so that an LDPC codeword boundary aligns with a symbol boundary within a continuous transmission for the multi-carrier communications; and transmitting the aligned LDPC codewords in the continuous transmission, wherein a number of bits varies among the symbols.

A twenty-first example can include the twentieth example wherein the operations further comprise: maintaining a substantially constant coding gain from among different transmissions for different LDPC codeword sizes.

A twenty-second example can include any one of the twentieth through twenty-first examples, wherein the operations further comprise: synchronizing one or more LDPC code settings with a receiver or a transmitter in response to a peer device selecting a different LPDC setting comprising a codeword length or a number of puncturing bits for a different data rate.

Examples can include an apparatus comprising means to perform one or more elements of a method described in or related to any of examples (embodiments) above, or any other method or process described herein.

Examples can include one or more non-transitory computer-readable media comprising instructions to cause an electronic device, upon execution of the instructions by one or more processors of the electronic device, to perform one or more elements of a method described in or related to any of examples above, or any other method or process described herein.

Examples can include an apparatus comprising logic, modules, or circuitry to perform one or more elements of a method described in or related to any of examples above, or any other method or process described herein.

Examples can include a method, technique, or process as described in or related to any of examples above, or portions or parts thereof.

Examples can include an apparatus comprising: one or more processors and one or more computer readable media comprising instructions that, when executed by the one or more processors, cause the one or more processors to perform the method, techniques, or process as described in or related to any of examples above, or portions thereof.

Examples can include a method of communicating in a wireless network as shown and described herein.

Examples can include a system for providing wireless communication as shown and described herein.

Examples can include a device for providing wireless communication as shown and described herein.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Techniques described herein can be used for various wireless communication systems such as CDMA, TDMA, FDMA, OFDMA, SC-FDMA and other systems. The terms "system" and "network" are often used interchangeably. A CDMA system can implement a radio technology such as Universal Terrestrial Radio Access (UTRA), CDMA1800, etc. UTRA includes Wideband-CDMA (W-CDMA) and other variants of CDMA. Further, CDMA1800 covers IS-1800, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.18, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA1800 and UMB are described in documents from an organization named "3rd Generation Partnership Project 2" (3GPP2). Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product can include a computer readable medium having one or more instructions or codes operable to cause a computer to perform functions described herein.

Communications media embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the s and/or actions of a method or algorithm can reside as one or any combination or set of codes and/or instructions on a machine-readable medium and/or computer readable medium, which can be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature can have been disclosed with respect to only one of several implementations, such feature can be combined with one or more other features of the other implementations as can be desired and advantageous for any given or particular application.

What is claimed is:

1. An apparatus employed in a digital subscriber line (DSL) network comprising:
   processing circuitry, comprising a memory with executable instructions, configured to:
      generate a plurality of symbols of multi-carrier communications that comprises frames in a continuous transmission and codewords derived from block codes to enable a modulation for a parity check; and
      align the codewords with a symbol boundary of the plurality of symbols based on one or more code settings;
   a DSL interface, configured to provide, to communication circuitry, data for a transmission of the plurality of symbols, wherein the plurality of symbols comprises discrete multi-tone (DMT) symbols or orthogonal frequency-division multiplexing (OFDM) symbols.

2. The apparatus of claim 1, wherein the processing circuitry is further configured to:
   generate at least one of: a puncturing of parity bits, a shortening of data bits, or a change in circulant size related to the codewords based on a target coding gain or code rate to align codeword sizes of the codewords with the symbol boundary of the plurality of symbols by varying a codeword size.

3. The apparatus of claim 1, wherein the DSL interface is further configured to:
determine the one or more code settings comprising at least one of: a codeword size, a number of puncturing bits, or a number of encoded bits per codeword.

4. The apparatus of claim 1, wherein the DSL interface is further configured to:
modify the one or more code settings in response to a change in a data rate of a channel or line of the DSL interface, wherein the one or more code settings comprise at least one of: a codeword size, a number of puncturing bits, or a number of codewords per frame/subset of the plurality of symbols.

5. The apparatus of claim 1, wherein the processing circuitry is further configured to:
determine a number of codewords per subset of the plurality of symbols or per frame of the continuous transmission based on a first set of conditions in response to a codeword spanning over up to four symbols, based on a second set of conditions in response to the codeword satisfying a defined threshold codeword size.

6. The apparatus of claim 1, wherein the processing circuitry is further configured to:
select a number of LDCP codewords per DMT symbol of the plurality of symbols based on a number of consequent DMT symbol positions from one symbol up to a frame of symbols in order to align the LDCP codewords with the symbol boundary of the plurality of symbols.

7. The apparatus of claim 1, wherein the processing circuitry is further configured to:
select a number of codewords per subset of the plurality of symbols based on a set of rules or conditions according to one or more of: a number of encoded bits per codeword or a codeword size.

8. The apparatus of claim 1, wherein the processing circuitry is further configured to:
in response to a ratio of a minimum codeword size being greater than a threshold ratio, modify a selection of a number of codewords per symbol from among a first set of conditions to a second set of conditions.

9. The apparatus of claim 1, wherein the codewords comprise unequal sizes, and the processing circuitry is further configured to:
maintain a size of at least one codeword equal to or greater than a minimum codeword size, while increasing or maximizing a size of other codewords of the transmission.

10. The apparatus of claim 1, wherein the processing circuitry is further configured to:
in response to estimating a noise per DMT carrier, determine a bit allocation table, and compute a number of encoded bits per DMT codeword;
determine a number of codewords per subset of symbols or a frame of symbols, and a codeword size;
determine a number of puncturing bits based on a target coding gain;
communicate the bit allocation table, the codeword size and the number of puncturing bits with a time instant for activation; and
activate the bit allocation table at the time instant.

11. The apparatus of claim 1, wherein a number of bits in a symbol of the plurality of symbols varies based on a frequency of the multi-carrier communications and a noise condition of a channel, and wherein the continuous transmission is based on at least one of: an xDSL, a G.fast or an MG FAST standard specification for the codewords, and one or more of the codewords span across one or more of the plurality of symbols.

12. A system employed in a digital subscriber line (DSL) network comprising:
processing circuitry, comprising a memory with executable instructions, configured to:
process multi-carrier communications comprising a plurality of discrete multi-tone (DMT) symbols; and
align low-density parity-check (LDPC) codewords with one or more DMT symbol boundaries of the plurality of DMT symbols in the multicarrier communications based on a set of settings for puncturing a number of parity bits and shortening a number of data bits of the LDPC codewords;
a DSL interface, configured to provide, to communication circuitry, data for a transmission of the DMT symbols.

13. The system of claim 12, wherein the processing circuitry is further configured to confine one or more LDPC codewords to one or more DMT symbols of the plurality of DMT symbols or to a transmission frame based on a target code rate.

14. The system of claim 12, wherein the processing circuitry is further configured to generate the LDPC codewords comprising same sizes based on a defined number of LDPC coded bits per carrier, or of unequal sizes by keeping a size of at least one codeword equal to or greater than a minimum LDPC codeword size $N_{min}$ and maximizing a size of other $n_{cw}-1$ codewords of the LDPC codewords to be greater in size than the minimum LDPC codeword size.

15. The system of claim 12, wherein the processing circuitry is further configured to:
generate the LDPC codewords comprising a codeword size by puncturing the number of parity bits and shortening the number of data bits by selecting different LDPC code settings that include one or more of: a target signal to noise ratio (SNR), a symbol error rate, a number of shortening bits, or a number of puncturing bits based on a target coding gain.

16. The system of claim 15, wherein the processing circuitry is further configured to:
implement the selected settings between a receiver and a transmitter devices based on at least one of: a bit allocation table or a number of encoded bits per sub-carrier, being synchronized autonomously or by a peer initiated re-configuration and communication therebetween by either the transmitter or the receiver initially.

17. The apparatus of claim 12, wherein the processing circuitry is further configured to:
align the LDPC codewords to the one or more DMT symbols in a continuous transmission, or to a full transmission frame of DMT symbols by aligning ends of the LDPC codewords at an end of the one or more DMT symbols or the full transmission frame by configuring the puncturing or the shortening based on a target coding gain.

18. The system of claim 12, wherein the processing circuitry is further configured to:
generate robust management control (RMC) symbols and data symbols with a same number of LDPC coded bits per DMT codeword as the LDPC codewords; or
determine a number of LDPC codewords aligning with one or more RMC symbols when the RMC symbols and the data symbols do not comprise the same number of LDPC coded bits per DMT codeword based on a different set of rules for selecting the number of LDPC codewords than for the data symbols.

19. The system of claim 12, wherein the processing circuitry is further configured to:
- generate different bit loading tables (BATs) associated with a full-duplex downstream priority sub-frame (FDS) and a full-duplex upstream priority sub-frame (FUS), or associated with a normal operation interval (NOI) of a discontinuous operation and a discontinuous operation interval (DOI) of the discontinuous operation, wherein the FDS and the FUS, or the NOI and the DOI, utilize a different number of codewords per symbol; and
- in response to one or more of the LPDC codewords being spread over more than one symbol of the symbols, use another number of codewords for a group of symbols on a downstream boundary and an upstream boundary.

20. A computer readable storage medium storing executable instructions that, in response to execution, cause one or more processors of a DSL device to perform operations for multi-carrier communications, the operations comprising:
- generating symbols with low-density parity-check (LDPC) codewords that enable LDPC coded modulation (LCM);
- aligning the LDPC codewords with one or more symbol boundaries of the symbols so that an LDPC codeword boundary aligns with a symbol boundary within a continuous transmission for the multi-carrier communications; and
- transmitting the aligned LDPC codewords in the continuous transmission, wherein a number of bits varies among the symbols.

21. The computer readable storage medium of claim 20, wherein the operations further comprise:
- maintaining a substantially constant coding gain from among different transmissions for different LDPC codeword sizes.

22. The computer readable storage medium of claim 20, wherein the operations further comprise:
- synchronizing one or more LDPC code settings with a receiver or a transmitter in response to a peer device selecting a different LPDC setting comprising a codeword length or a number of puncturing bits for a different data rate.

* * * * *